United States Patent
Bukkems et al.

(10) Patent No.: US 9,890,928 B2
(45) Date of Patent: Feb. 13, 2018

(54) FLAT LIGHTING DEVICE

(71) Applicant: PHILIPS LIGHTING HOLDING B.V., Eindhoven (NL)

(72) Inventors: Peter Johannes Martinus Bukkems, Deurne (NL); Peter Rijskamp, Venray (NL); Simon Eme Kadijk, Veldhoven (NL); Johannes Petrus Maria Ansems, Hulsel (NL)

(73) Assignee: PHILIPS LIGHTING HOLDING B.V., Eindhoven (NL)

( * ) Notice: Subject to any disclaimer, the term of this patent is extended or adjusted under 35 U.S.C. 154(b) by 220 days.

(21) Appl. No.: 14/649,356

(22) PCT Filed: Dec. 5, 2013

(86) PCT No.: PCT/IB2013/060662
§ 371 (c)(1),
(2) Date: Jun. 3, 2015

(87) PCT Pub. No.: WO2014/087363
PCT Pub. Date: Jun. 12, 2014

(65) Prior Publication Data
US 2016/0305615 A1  Oct. 20, 2016

Related U.S. Application Data

(60) Provisional application No. 61/733,476, filed on Dec. 5, 2012.

(30) Foreign Application Priority Data

Dec. 5, 2012 (EP) .................................. 12195700
Mar. 19, 2013 (EP) .................................. 13159889
Mar. 19, 2013 (EP) .................................. 13159895

(51) Int. Cl.
*F21V 7/22* (2018.01)
*F21V 29/503* (2015.01)
(Continued)

(52) U.S. Cl.
CPC .................. *F21V 7/22* (2013.01); *F21K 9/23* (2016.08); *F21K 9/232* (2016.08); *F21K 9/238* (2016.08);
(Continued)

(58) Field of Classification Search
CPC ............. F21Y 2101/00; F21Y 2103/10; F21Y 2103/30; F21Y 2103/33
(Continued)

(56) References Cited

U.S. PATENT DOCUMENTS 5,463,280 A   10/1995  Johnson
8,414,147 B2 *  4/2013  Thrailkill .............. F21V 29/004
                                                     362/235
(Continued)

FOREIGN PATENT DOCUMENTS

DE   202011108614 U1   1/2012
DE   102011006749 A1   10/2012
(Continued)

*Primary Examiner* — Karl D Frech
(74) *Attorney, Agent, or Firm* — Meenakshy Chakravorty

(57) ABSTRACT

The present invention relates to a flat lighting device (1) comprising a carrier (2) including a thermally conductive layer (7), at least one solid state light source (3) arranged on a front side of the carrier (2), and an electrically insulating cover member (5a, 5b) in thermal contact with said front side and a back side opposite said front side. The cover member (5a, 5b) is adapted to transfer heat from said carrier (2) out of the lighting device. The cover member (5a, 5b) comprises an optical structure (4) arranged on the carrier (2)
(Continued)

in front of the at least one light source (3) and adapted to direct the light emitted by the at least one solid state light source (3).

21 Claims, 11 Drawing Sheets

(51) Int. Cl.
| | |
|---|---|
| H05K 1/02 | (2006.01) |
| H05K 1/18 | (2006.01) |
| F21V 29/506 | (2015.01) |
| F21V 29/70 | (2015.01) |
| F21V 23/00 | (2015.01) |
| F21K 9/23 | (2016.01) |
| F21K 9/232 | (2016.01) |
| F21K 9/60 | (2016.01) |
| F21K 9/61 | (2016.01) |
| F21V 29/74 | (2015.01) |
| F21V 29/80 | (2015.01) |
| F21V 5/04 | (2006.01) |
| F21V 15/01 | (2006.01) |
| F21V 19/00 | (2006.01) |
| F21K 9/238 | (2016.01) |
| F21K 9/90 | (2016.01) |
| F21V 3/02 | (2006.01) |
| F21Y 105/10 | (2016.01) |
| F21Y 115/10 | (2016.01) |
| F21Y 107/90 | (2016.01) |

(52) U.S. Cl.
CPC .......... *F21K 9/60* (2016.08); *F21K 9/61* (2016.08); *F21V 5/04* (2013.01); *F21V 15/01* (2013.01); *F21V 19/003* (2013.01); *F21V 19/006* (2013.01); *F21V 23/003* (2013.01); *F21V 29/503* (2015.01); *F21V 29/506* (2015.01); *F21V 29/70* (2015.01); *F21V 29/74* (2015.01); *F21V 29/80* (2015.01); *H05K 1/0209* (2013.01); *H05K 1/189* (2013.01); *F21K 9/90* (2013.01); *F21V 3/02* (2013.01); *F21Y 2105/10* (2016.08); *F21Y 2107/90* (2016.08); *F21Y 2115/10* (2016.08); *H05K 2201/10106* (2013.01)

(58) Field of Classification Search
USPC ....... 362/235, 236, 294, 373, 186, 221, 227, 362/234
See application file for complete search history.

(56) References Cited

U.S. PATENT DOCUMENTS

| | | | |
|---|---|---|---|
| 8,894,238 B2* | 11/2014 | Marinus | .................. F21V 3/02 362/249.02 |
| 2007/0121326 A1 | 5/2007 | Nall et al. | |
| 2008/0291631 A1 | 11/2008 | Hellinger et al. | |
| 2009/0103296 A1 | 4/2009 | Harbers et al. | |
| 2010/0181885 A1 | 7/2010 | Tessnow et al. | |
| 2011/0032708 A1 | 2/2011 | Johnston et al. | |
| 2012/0002408 A1 | 1/2012 | Lichten et al. | |
| 2012/0002425 A1 | 1/2012 | Shimizu et al. | |
| 2012/0069570 A1 | 3/2012 | Marinus | |
| 2012/0074827 A1 | 3/2012 | Hsieh et al. | |
| 2012/0175667 A1 | 7/2012 | Golle et al. | |

FOREIGN PATENT DOCUMENTS

| | | |
|---|---|---|
| EP | 2058584 A1 | 5/2009 |
| FR | 2926926 A1 | 7/2009 |
| GB | 2367883 A | 4/2002 |
| JP | 2011070971 A | 4/2011 |
| JP | 2012038466 A | 2/2012 |
| JP | 2012146552 A | 8/2012 |
| WO | 20110107925 A1 | 9/2011 |
| WO | 2011149237 A2 | 12/2011 |
| WO | 2012095758 A2 | 7/2012 |
| WO | 2013056516 A1 | 4/2013 |
| WO | 2014087366 A1 | 6/2014 |

* cited by examiner

FLAT LIGHTING DEVICE

CROSS-REFERENCE TO PRIOR APPLICATIONS

This application is the U.S. National Phase application under 35 U.S.C. § 371 of International Application No. PCT/IB313/060662, filed on Dec. 5, 2013, which claims the benefit of U.S. Provisional Patent Application No. 61/733,476, filed on Dec. 5, 2012, and European Patent Application No.12195700.5 filed on Dec. 5, 2012, European Patent Application No. 13159895.5 filed on Mar. 19, 2013, European Patent Application No. 13159889.8 filed Mar. 19, 2013. These applications are hereby incorporated by reference herein.

FIELD OF THE INVENTION

The present invention relates to flat lighting device comprising solid state light sources, and more specifically to flat lamp.

BACKGROUND OF THE INVENTION

Conventional LED lamps comprise a printed circuit board with LEDs arranged onto it. The printed circuit board is arranged in a horizontal manner when arranging the LED lamp in a standing position, or, if defining a longitudinal axis of the LED lamp, arranged with an angle to the longitudinal axis. In front of the printed circuit board in a light exit direction, a plastic or glass bulb is arranged in order to manipulate the emitted light from the LEDs, and to protect components inside the lamp. Below the printed circuit board, a number of components are arranged with the main purpose of spreading and transferring the heat generated by the LEDs. These may be a heat spreader, heat fins, a metal housing and a cap. Such LED lamp hence comprises a large number of components in order to perform all tasks of the lamp such as generating and distributing light, transferring heat, protect the electric connections and provide a fire enclosure.

An alternative LED lamp is disclosed in WO2011/107925A1, wherein a printed circuit board with a LED is arranged on a reflector. Such solution decreases the amount of components in the lamp. However, such lamp has its limitations in optical and thermal performance. Further, such arrangement may be sensitive to physical actuation and may not provide sufficient thermal properties for high lumen lamps.

Consequently, there is a need for a lamp that in a protective manner further increases the effectiveness in terms of optical and thermal properties.

SUMMARY OF THE INVENTION

It is an object of the present invention to provide a lighting device that provides an effective heat management.

According to a first aspect of the invention, this isachieved by a lighting device comprising a solid state light source, a carrier on which said solid state light source is arranged, such that an amount of heat generated by the light source is transmitted into the carrier. Further, a cover member is disposed on the carrier, whereby the light source is arranged between the carrier and a light-transmitting part of the cover member, such that a thermal interface exists between the carrier and the cover member and the thermal interface is arranged to transmit therethrough a majority of the heat transmitted into the carrier from the light source.

It is recognized by the present invention that the desired thermal properties of a lighting device can be achieved by having a short thermal path between the light source and the outside of the cover, where the heat is dissipated to the ambient. This is realized by a solid state light source disposed on a carrier to which the heat transmitted by the solid state light source is transferred. The thermal interface from the carrier to the cover member ensures a short thermal path to the outside of the lighting device.

This improved thermal performance is preferably realized when the carrier comprises a thermally conductive material having a first coefficient of thermal conductivity and the cover having a second coefficient of thermal conductivivity, the first coefficient of thermal conductivity being larger than the second coefficient of thermal conductivity.

In this way the heat is largely and quickly transferred to the carrier in the vicinity of the solid state light source, after which it is transferred via the thermal interface to the cover member, and from the outside of the cover member to the ambient. Preferably, the heat is radiated to the ambient in substantially the same direction of the light emission, meaning that the heat leaves the lighting device on the same side as the light.

In a preferred embodiment, the first coefficient of thermal conductivity is in the range from 100-300 W/mK, preferably between 160 and 240 W/mK, and the second coefficient of thermal conductivity is in the range from 0.2-10 W/mK, preferably between 0.5 and 5 W/mK.

In a further embodiment, the thermal conductive material is disposed as a thermal conductive layer on the carrier. This is, for instance, the case when the carrier is a printed circuit board, being the most familiar type of carrier. This conductive layer may be a metal layer like e.g. copper, which also shows an excellent electrical conductivity. Therefore, it can be used for making the electrical connections of the solid state light sources to the driver part of a lighting device.

The thermal performance can further be improved by a thermal interface material, TIM that is arranged to fill a space between the cover member and the carrier. The TIM may be sandwiched between the cover member and the printed circuit board. The TIM may be provided on either or both of the front side and back side of the printed circuit board. The TIM may fill irregularities in the surfaces of the printed circuit board and the cover member, i.e. filling air gaps at the interface between the two. The TIM has a higher thermal conductivity than air, and thereby increases the heat transfer between the printed circuit board and the cover member.

In this aspect of this invention, it is realized that this lighting device may further comprise a connection member having a fixed position relative to the carrier for mechanically and electrically connecting the lighting device to a socket. The carrier is having a relatively large front side compared with its edge side and the solid state light source is arranged on the front side of the carrier. The cover member has an outer surface being a portion of the outside of the lighting device and has an inner surface, opposite to the outer surface, that is in thermal contact with the front side of the carrier, such that the thermal interface is formed.

In this embodiment the present invention is applied to make, for instance a lighting device that is suitable for replacing a conventional incandescent type of lamp, also referred to as a retrofit lamp.

In a further embodiment, a second solid state light source arranged on a back side of the carrier being opposite to the front side, a second cover member disposed on the carrier, whereby the second light source is arranged between the carrier and a light-transmitting part of the second cover member, such that a thermal interface exists between the carrier and the second cover member, the second cover member having a second outer surface being a second portion of the outside of the lighting device and having a second inner surface being opposite to the second outer surface and being in thermal contact with the back side of the carrier, such that the second thermal interface is formed.

In this embodiment the front side and the back side of the lighting device may be constructed in a similar way. When this is used a retrofit lamp can be obtained that emits light in both direction respective to the front side and back side.

The thermal performance of these embodiments is ensured when at least 50%, preferably 90% of the front side of the carrier is in thermal contact with the inner surface of the cover member. The heat is dissipated by the solid state light sources and spread to the surroundings of the solid state light sources via the carrier; the larger the part of the carrier that is in thermal contact with the cover member, the better the heat transfer is from the carrier to the cover member.

According to a first aspect of the invention, this and other objects are achieved by a lighting device comprising a planar carrier including a thermally conductive layer, at least one solid state light source arranged on a front side of the carrier, and an insulating cover member in thermal contact with said front side and a back side opposite said front side, and said cover member being adapted to transfer heat from said carrier out of the lighting device. The cover member comprises an optical structure arranged on the carrier in front of the at least one light source and adapted to direct the light emitted by the at least one solid state light source.

Such lighting device may thereby provide an effective heat transfer from the printed circuit board and out of the arrangement with few parts and in a compact manner. Due to the thermal contact of the cover member with both sides of the printed circuit board, a majority of the heat generated by the light sources may be transferred by the cover member. The cover member may be in direct contact with the printed circuit board. The cover member may comprise an inner surface facing the printed circuit board. The inner surface may be in direct contact with the front and back side of the printed circuit board. The lighting device may further provide a cost efficient manufacturing process due the few parts. The an optical structure may be designed to direct the light from the light source through the cover member in a desired way. The light source and the printed circuit board may together provide the functions of converting power, generating light and spreading the heat generated. The cover member and lens may provide the functions of manipulating/directing the light from the light source, transferring the heat from the printed circuit board and providing electrical insulation and fire enclosure of the arrangement. The cover member may further have a protective purpose, protecting the printed circuit board and light source from external damage. The lighting device may be arranged in a cap for use in an electrical socket, or integrated in a luminaire. The printed circuit board may comprise two flat sides, the front side and the back side. The printed circuit board may further be planar. Light sources may be arranged on either one or both sides of the printed circuit board. The cover member may be arranged such that it is in thermal contact with both sides of the printed circuit board. The cover member may be arranged to be in thermal contact with a substantial part of the printed circuit board, such as at least half of the front side and back side of the printed circuit board. The cover member may be formed of a glass material, a plastic material, a ceramic material or the like. A normal plastic material for a cover member may provide sufficient thermal properties to provide a heat transfer function from the printed circuit board. To further improve the thermal properties of the cover member, the cover member may be made of a thermal plastic material. The printed circuit board may comprise a heat spreading layer for spreading the heat generated by the light sources over a large area of the printed circuit board. The heat spreading layer may for instance be a copper layer or an aluminum layer. The heat spreading layer may further be adapted to spread heat from the front side to the back side of the printed circuit board, and vice verse. In one embodiment, the printed circuit board may comprise more than one heat spreading layer. Further, in one embodiment, the printed circuit board may comprise an aluminum sheet metal provided with electrical connections of FR-4 or CEM-1 material. The aluminum sheet metal may thereby form the heat spreading layer and electrical interconnections.

In one embodiment, the cover member may be arranged to enclose the printed circuit board and the at least one solid state light source. Wherein the cover member encloses the printed circuit board, and is in contact with both the front side and the back side of the printed circuit board, the cover member may provide the required stiffness to the arrangement in order to hold the printed circuit board. The printed circuit board may then be made very thin, for instance as thin as 0.2 mm. Since the cover member encloses both front and back side of the printed circuit board, the printed circuit board will anyway be held in place. The printed circuit board thereby does not need to provide stability to the arrangement, but may be focused on heat spreading, holding the light source and providing electrical tracks to the light source. By enclosing the printed circuit board, the cover member may be in thermal contact with a large part of the printed circuit board, such as at least ninety percent of an external surface of the printed circuit board. The cover member may further be in thermal contact with edge surfaces of the printed circuit board. The edge surfaces may together with the front side and back side form a total external surface of the printed circuit board. The heat transfer from the printed circuit board may thereby be improved. The cover member may have an inner side and an outer side, wherein the inner side is in contact with the printed circuit board and adapted to transfer heat from the inner side to the outer side.

The cover member may in one embodiment be formed of a transparent material and the lens may be formed as an integrated part of the cover member. The cover member and the lens may be formed of the same material in one piece. The material of the cover member including the lens may thereby provide both the thermal properties for heat transfer and the optical properties of the lens, directing the light from the light source. The material may be transparent or translucent due to the optical properties. The cover member and lens may be molded in one common piece. Alternatively, the cover member may be formed of a thermally conductive material, and as a separate part from the an optical structure which is formed of a transparent or translucent material. The lens may be formed of a material different from the material of the cover member. The material of the cover member may be designed for providing good heat transfer properties, such as a material with low thermal resistivity. The cover member may be non-transparent. The different material of the lens may be designed for good optical performance in directing the light from the light source. The lens may however have some thermal conductivity, i.e. contribute to the heat transfer from the printed circuit board. An inner side surface of the lens, which may be in contact with the printed circuit board, may be designed to maximize the heat transfer from the printed circuit board to the lens. Such inner side surface may be flat.

In one embodiment, the cover member may comprise a first and a second cover part adapted to be attached to each other and to be in contact with the front side and the back side of the printed circuit board respectively. The cover member may be in two parts, thereby facilitating the manufacturing and the assembly of the lighting device. The two parts may comprise fastening means arranged to mate with each other in order to be fixed the two parts to each other. Such fastening means may be a snap coupling, glue, screws, ultrasonic welding or the like. The printed circuit board may be sandwiched between the two cover parts when assembled. The first cover part may thereby be in thermal contact with the front side of the printed circuit board, and the second cover part may be in thermal contact with the back side of the printed circuit board. Further the first cover part may comprise a protrusion adapted to extend through an opening in the printed circuit board to align the printed circuit board inside the cover member. To align the printed circuit board inside the cover member, the cover member may comprise a protrusion extending through an opening in the printed circuit board. The position of the printed circuit board relative to the cover member may thereby be fixed. The protrusion on the first cover part may be adapted to mate with corresponding means on the second cover part, thereby fixing the two parts to each other and sandwiching the printed circuit board in between.

In a further embodiment, the at least one solid state light source may comprise a plurality of solid state light sources arranged with a distance to each other, or arranged in subgroups with a distance between each subgroup, and wherein the an optical structure may comprise a number of lenses equal to the number of separated solid state light sources or the number of separated subgroups of solid state light sources. To provide a lighting device which provides a light output of a certain amount, a plurality of light sources may be arranged on the printed circuit board. The plurality of lenses may each be designed to direct light from one light source or a subgroup of light sources arranged together. By spreading the light sources or subgroups of light sources on the printed circuit board, the heat generated by the light sources may further be spread along the extension area of the printed circuit board. This may improve the heat spreading and heat transfer function of the arrangement due to a more efficient heat spreading in the printed circuit board, which provides a more efficient heat transfer by the cover member. By providing a number of lenses equal to the number of light sources or subgroups of light sources, the total light output from the lighting device may be highly controllable. The lens for a specific light source or subgroup of light sources may be specially designed for that light source or subgroup, and may be different from another lens for another light source or subgroup. For instance, the light output may be directed in certain directions by each lens such that the total light output is optimized for a specific purpose. Further, each light source or subgroup may be controlled by a driver or controller to provide a light output unique for that specific light source or subgroup.

In one embodiment, the lighting device may have a longitudinal axis and the printed circuit board may extend in a first plane in parallel with the longitudinal axis. The lighting device may further comprise a cap, and wherein the printed circuit board is arranged on said cap. The cap may be adapted to fit in an electrical socket. The arrangement of the printed circuit board in the cap, extending in a plane along the longitudinal axis may provide a lighting device with few parts. The longitudinal axis may extend through the center of the cap. The at least one light source arranged on the printed circuit board may thereby emit light in a main direction which is perpendicular to the longitudinal axis. The lens may however direct light in a plurality of directions, including a direction substantially in parallel with the longitudinal axis. The cover member, which may enclose the printed circuit board, may thereby extend in the same plane as the printed circuit board, and also be arranged in said cap. The cover member, the an optical structure, and the cap may provide an entire outer surface of the lighting device, together enclosing the printed circuit board and the at least one light source.

Alternatively, the printed circuit board may extend in a plane perpendicular to said longitudinal axis. The printed circuit board may thereby be arranged with light sources providing a spotlight arrangement. The cover member may be arranged to be in contact with both the front and back side of the printed circuit board in order to provide the same thermal properties as for a lighting device with a printed circuit board in parallel with the longitudinal axis.

In another embodiment, a first section of the cover member encloses the printed circuit board extending in said first plane, and wherein a second section of the cover member extends in a second plane with an angle to said first plane. A further extension of the cover member may improve the heat transfer capability of the cover member due to a larger surface exposed to the surroundings of the lighting device. The second section of the cover member may extend in parallel with the longitudinal axis. The two sections of the cover member may thereby form a cross shaped cross section when seen in direction of the longitudinal axis. Alternatively may the second plane be transverse to the longitudinal axis as well as the first plane. If an outer surface of the cover member is a reflective surface, or is provided with a reflective coating, the second section of the cover member may improve the optical performance of the lighting device. Yet alternatively, for a spotlight arrangement, the second plane may be in parallel with the longitudinal axis, and with an angle to the first plane. The cover member may comprise further additional sections, such as a third and a fourth section. The sections may form various formations. For instance three sections of the cover member may form a triangle shape. Further, the printed circuit board may be a first printed circuit board, and wherein the lighting device further comprises a second printed circuit board enclosed by the second section of the cover member. The second printed circuit board may be arranged to extend in said second plane transversal to the first plane in which the first printed circuit board extends. The second printed circuit board may be provided with at least one solid state light source. The second section of the cover member may be provided with an optical structure corresponding to the light source on the second printed circuit board. By providing the second printed circuit board and the light source thereon, light may be emitted from the lighting device in additional directions. The optical performance of the lighting device may thereby be improved.

In one embodiment, the optical structure may be designed to provide non-symmetric optical properties. The optical structure may be designed to direct the light from the at least one solid state light source in a non-symmetrical manner, providing a non-rotational symmetry of the luminous intensity distribution. That is, a circular or dome shaped lens may provide a non-uniform light output along its light output directions. When the arrangement comprises a plurality of light sources and a plurality of lenses, the lenses may be non-symmetrically designed such that the overall light output from the arrangement is uniform or in an otherwise desired way. The non-symmetric lens may be designed to direct a minimum amount of light towards a neighboring lens. The lens may comprise an inner cavity, which inner cavity surrounds the light source(s) which the lens is arranged in front of. The inner cavity may be shaped in order to provide the non-symmetric luminous intensity distribution of the lens. Due to the shape of the inner cavity, the refraction of the light from the light source(s) reaching the lens may provide a desired luminous intensity distribution. Alternatively, the non-symmetry of the lens may be provided by the design of an outer surface of the lens.

In an alternative embodiment, said printed circuit board may be a first printed circuit board with a first front and back side having at least one solid state light source arranged on the first front side, wherein the lighting device further may comprise a second printed circuit board with a second front and back side and having at least one solid state light source arranged on said second front side, and wherein said second printed circuit board is arranged in parallel with said first printed circuit board. A lighting device comprising two flat light source holding plates in the same cap may provide an arrangement with an improved thermal resistance. I.e. the thermal resistance of the cover member in thermal contact with both printed circuit boards may be lowered. The cover member may be in thermal contact with the front sides and back sides of both printed circuit boards. The cover member may enclose both the first and the second printed circuit boards. Each front side of the printed circuit boards may be provided with one or more light sources. The two front sides may be directed in opposite directions. Heat from the light sources on the front sides may be spread also to the respective back side, thereby increasing the thermal performance of the arrangement.

In an alternative embodiment, the printed circuit board may be formed as an integrated part of the cover member. The printed circuit board may be a part of an inner surface of the cover member. The electrical connections of the printed circuit board may be printed directly on said inner surface of the cover member, and the light sources may be arranged on said inner surface.

In one embodiment, the printed circuit board and the cover member may have a curved shape. The printed circuit board may extend in a bent or curved plane which has a radius. The cover member may have a corresponding shape and be in thermal contact with the front and back side of the curved printed circuit board. A flexible board material may be used for forming the printed circuit board. Such formed lighting device may in some embodiments provide improved optical performance of the arrangement.

Further, the printed circuit board may be a first printed circuit board and the lighting device may further comprise a second and a third printed circuit board, wherein the three printed circuit boards may be arranged with angles relative each other, and wherein the cover member may be in thermal contact with a front side and a back side of all printed circuit boards. An arrangement with the thermal properties and compact arrangement of the present invention may thereby be used in an embodiment with improved optical performance. The three printed circuit boards may be arranged, each with a longitudinal edge in contact with corresponding edges of the other printed circuit boards. Such longitudinal edge may coincide with a longitudinal axis of the lighting device. The printed circuit board may form a star like shape of the lighting device. The lighting device may also comprise further printed circuit boards forming other shapes and providing other optical performance, which may be desired in certain applications.

In another embodiment, the printed circuit board may have a buckled surface forming two printed circuit board sections extending with an angle to each other. In this embodiment, buckled means that the two carrier sections are coupled to each other in such a way that the two carrier sections may be directed slightly differently, forming an angular bent shape of the carrier. Both carrier sections may be provided with light sources which thereby may emit light in different directions. The two carrier sections may be arranged in parallel with a longitudinal axis of the lighting device, but with an angle relative to each other. Alternatively, both sections may be arranged in parallel with an axis perpendicular to the longitudinal axis.

In another embodiment, the carrier is a double-helical shaped surface positioned in parallel to the longitudinal axis. This shape has the advantage that the solid state light sources that are connected to the carrier are now directed in other directions than only perpendicular to the longitudinal axis. Note that the double-helical shaped surface has the property that a normal to this surface is in general not perpendicular to the longitudinal axis of the lighting device. This will lead to a lighting device having a more uniform luminous intensity distribution. Preferably, the double-helical surface has a first end pointing in the direction of the connection member, and a second end pointing away from said connection member, wherein the respective orientations of double-helical surface perpendicular to the longitudinal axis at the first end and at the second end differ by an angle in the range from 15°-360°. A uniform light distibution may be realized when the respective orientations differ by about 90°, even a difference in orientation of about 45° may give an acceptable performance.

For the embodiments that comprise the second solid state light source, the lighting device may comprise electical connections for independently powering the solid state light source and the second solid state light source. This has the advantage that different light sources, for instance those on the front side and those on the back side, can be addressed independently. This may be for indendently switching them on and off, but it may also be for dimming or colour changing aspects.

It is noted that the invention relates to all possible combinations of features recited in the claims.

BRIEF DESCRIPTION OF THE DRAWINGS

Various aspects of the invention, including its particular features and advantages, will be readily understood from the following detailed description and the accompanying drawings, in which.

DETAILED DESCRIPTION

Figure 1:
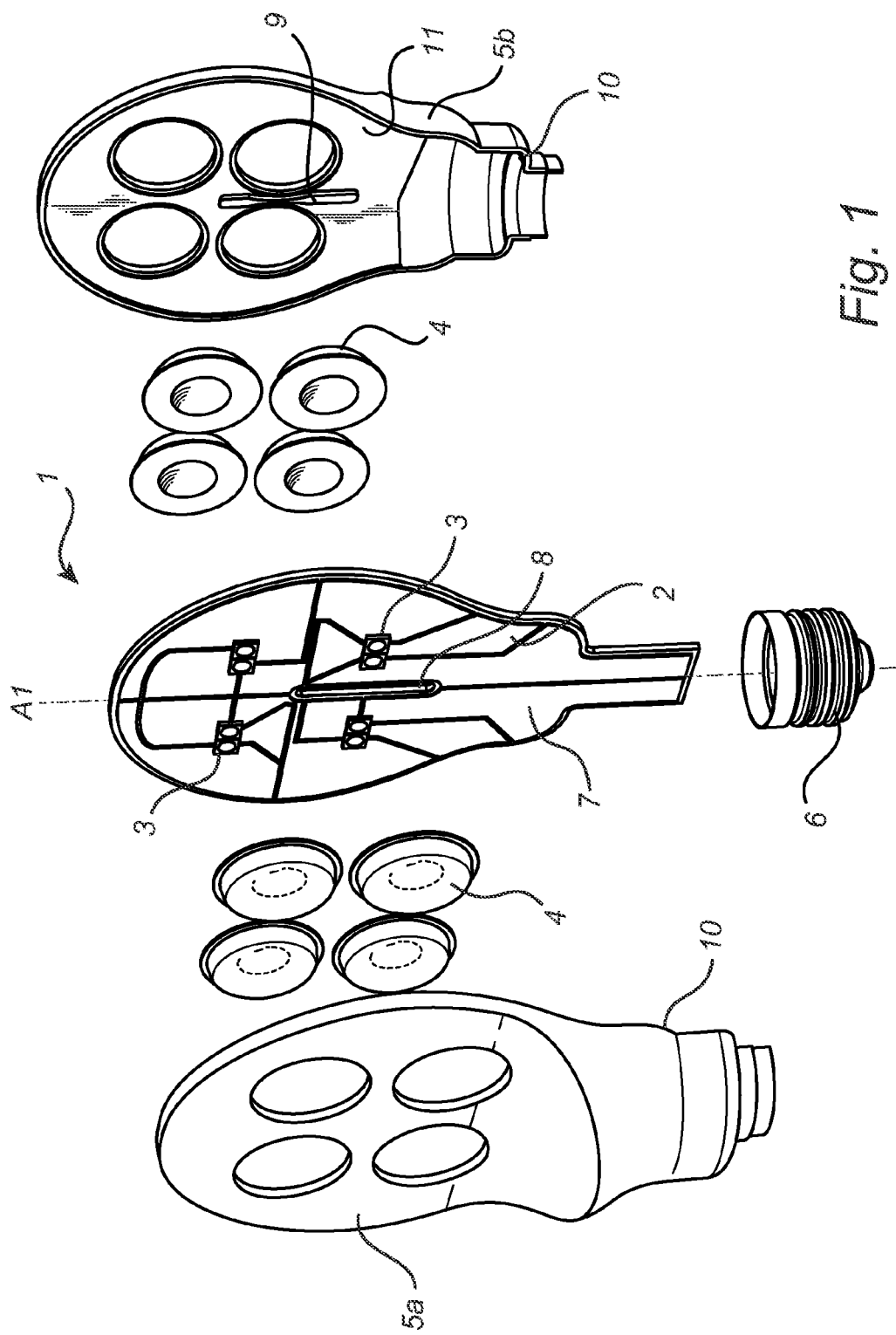
FIG. 1 is an exploded view of a lighting device according to an embodiment of the invention, comprising optical structures in the form of separate lenses.

The present invention will now be described more fully hereinafter with reference to the accompanying drawings, in which currently preferred embodiments of the invention are shown. This invention may, however, be embodied in many different forms and should not be construed as limited to the embodiments set forth herein; rather, these embodiments are provided for thoroughness and completeness, and fully convey the scope of the invention to the skilled person. Like reference characters refer to like elements throughout.

In FIG. 1, an exploded view of a flat lighting device, such as a flat lamp 1, is shown. The flat lamp 1 is shown in a standing manner defining a longitudinal axis A1. The flat lamp 1 comprises a carrier 2, like for instance a printed circuit board (PCB), a plurality of light sources 3, such as LEDs, OLEDs and PLEDs or the like, placed on the carrier 2, a plurality of lenses 4, a first cover member 5a and a second cover member 5b arranged to cover each side of the carrier 2, and a cap 6, adapted to be fitted in an electrical socket.

The carrier 2 may be a printed circuit board (PCB). Different types of PCBs are commonly used like a PCB with an insulating core covered on both sides with a copper layer, or the carrier may be of the FR4 type, that is, an aluminium spreader provided with a PCB and thin copper layer on both sides of the aluminium.

The carrier 2 defines a plane extending along the longitudinal axis A1, and is arranged in the cap 6. The electrical connection from the electrical socket may be directly coupled from the cap 6 to the carrier 2, or it may be wire connections between the cap 6 and the carrier 2. Further, the electrical connection may comprise additional electronic components, for instance for driving the light sources 3. In the illustrated embodiment, the light sources 3 are arranged in separated subgroups, wherein each subgroup comprises two light sources 3. A subgroup may alternatively comprise one light source. The flat lamp 1 is symmetrically arranged, having four subgroups of light sources 3 placed on each side of the carrier 2 in the same pattern. The cover member 5a, 5b is adapted to support the lenses 4. Each lens 4 is arranged in front of a subgroup of light sources 3. The cover members 5a, 5b are adapted to be in thermal connection with the carrier 2 and transfer heat away from the heat source, i.e. the light source 3, via the carrier 2 and further to the ambient air. The cover members 5a, 5b are of a thermally conductive material such as plastic, glass, thermal plastic or ceramic or the like, preferably a material with low thermal resistivity.

The second cover member 5b comprises a protrusion 9 with a corresponding opening or recess 8 on the carrier 2. The recess 8 and the protrusion 9 are arranged to align the carrier 2 and the cover members 5a, 5b correctly at assembly before joining the parts. In order to provide a good heat transfer, the cover members 5a, 5b, are arranged to cover a large part of the area of the carrier 2. The carrier 2 has a front side and a back side. The carrier 2 further comprises a layer of a thermally conductive material 7. This material may be spread evenly across the area of the carrier 2 on each side in order to spread any heat that may arise from the light sources 3. The material that may be used for the thermal conductive layer 7 may be any material with required thermal conductive properties, such as copper. By adding a layer 7 of a thermally conductive material, the heat may be evenly distributed across the carrier 2, therewith reducing the number of zones with excessive heat, and the heat is transported through the cover members 5a, 5b to the ambient.

An inner surface 11 of the respective cover members 5a, 5b is arranged to be in thermal contact with the front side and the back side, and preferably the thermally conductive layer, of the carrier 2 for good heat transfer.

The heat transfer between the carrier and the cover member may be improved by providing a thermal interface material, TIM, in between. The TIM may be provided on either or both of the front side and back side of the carrier. In order to increase the heat transfer between the carrier 2 and the cover members 5a, 5b, it is preferred to apply a layer of a thermal interface material (not shown), TIM, between the carrier 2 and the cover members 5a, 5b.

The TIM may be arranged on the front and/or back side of the carrier to be pressed between the cover member and the printed circuit board. The TIM may fill irregularities in the surfaces of the carrier and the cover member, i.e. filling air gaps at the interface between the two. The TIM may be arranged to decrease the amount of trapped air in and prevent the presence of micro bubbles between the carrier 2 and the inside 11 of the cover member. The TIM has a higher thermal conductivity than air, and thereby increases the heat transfer between the carrier and the cover member.

A flat lamp 1 according to the invention may be arranged to suit any size and shape of a retrofit lamp. The carrier 2 and the cover member 5 may be shaped and sized to suit any requirements. For instance the flat lamp 1 may apply the shape of any standard or decorative lamp. It may also be possible that the carrier 2 has another shape than being flat.

Each lens 4 is adapted to distribute the light from the light sources 3 in a predetermined manner according to a certain light scheme. The lens 4 may therefore be of a substantially transparent material, although possibly translucent. The lens 4 may also be arranged to transfer heat arising from the light source 3. Depending on a number of choices, such as material, manufacture, luminous intensity distribution requirements, heat properties and such, the lenses 4 may be made from another material, hence separate from the cover member 5a, 5b, or alternatively fully incorporated in the cover member 5a, 5b.

Figure 2:
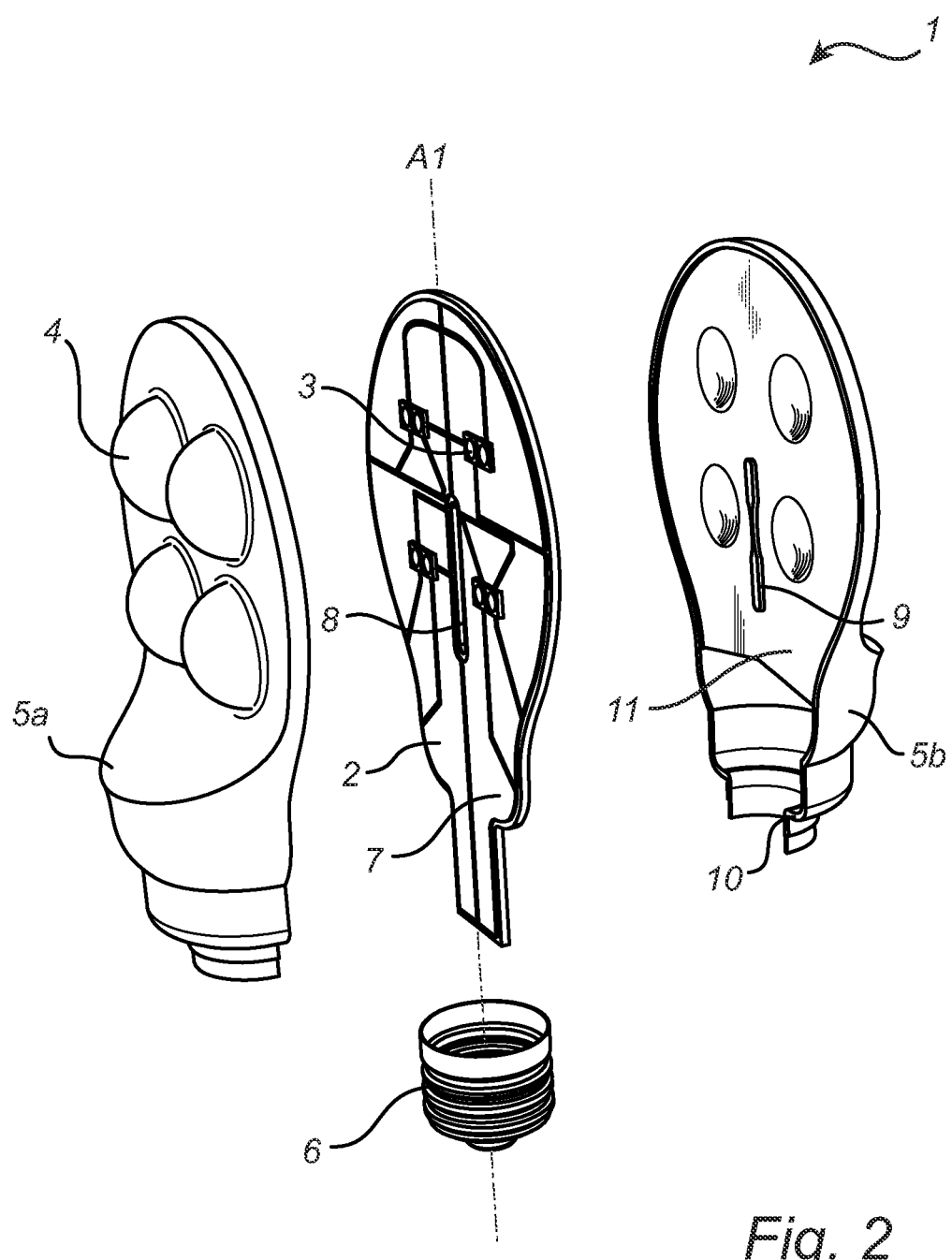
FIG. 2 is an exploded view of a lighting device according to an embodiment of the invention, comprising optical structures in the form of lenses integrated in the cover members.

In FIG. 2, an exploded view of the flat lamp 1 is shown, wherein the lenses 4 are integrated with the cover member 5a, 5b. The cover member 5 may thus constitute the same material as the lens 4, and thereby distribute some of the light emitted from the light source. In order to ensure complete coverage of the carrier 2, the cover member 5a, 5b comprises two parts, a first part 5a and a second part 5b, to be arranged on each side of the carrier 2 and fastened together at a joint 10 along their rims. Depending on manufacturing and assembly capabilities, the cover member 5a, 5b may be arranged with the joint elsewhere, or if possible, cast in one single piece. It is further possible to assemble the two parts 5a, 5b of the cover member by a click arrangement. The joining may alternatively involve gluing or welding of the two parts 5a, 5b together, possibly along the outer rim of the cover member. Alternatively the cover member may be joined by screwing, or any other joining operation that may be suitable and technically available.

The cap 6 in FIG. 1 is provided with a thread to suit an electrical socket. The type of fitting of the cap 6 may however be different depending on the requirements. For instance the fitting may be arranged as a bayonet fitting, a pin fitting (such as of GU10 type) or any other fitting that may be suitable for a flat lamp 1. It may also be of any size suitable for that particular lamp 1.

Figure 3:
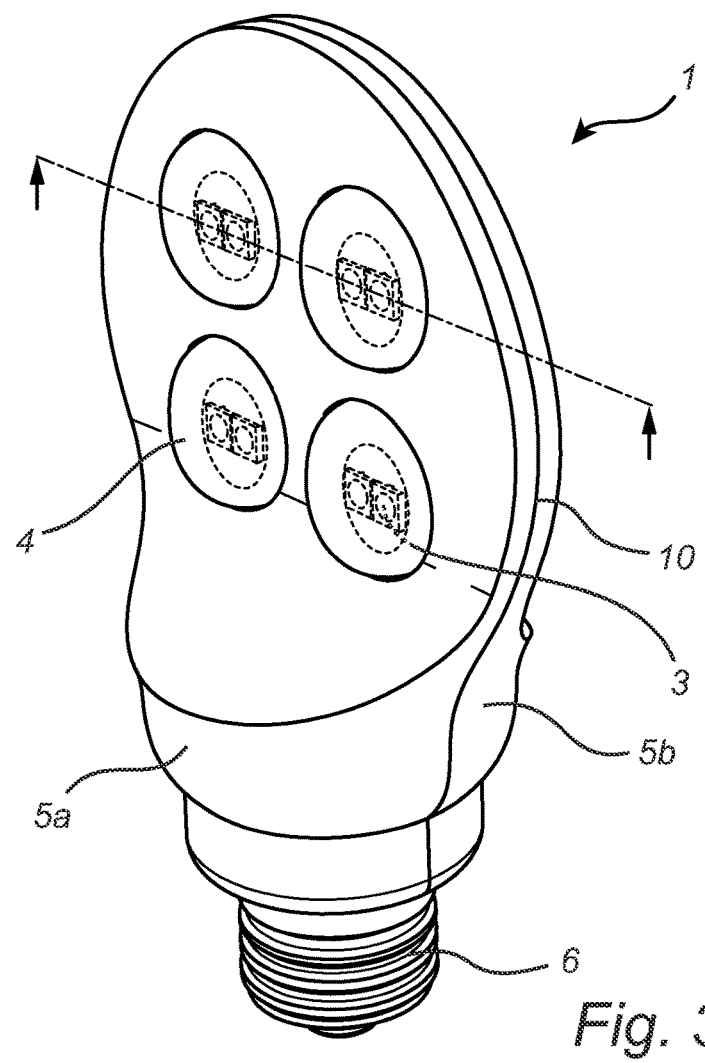
FIG. 3 is a perspective view of a lighting device according to an embodiment of the invention.

FIG. 3 shows a schematic view of a fully assembled flat lamp 1 as the one in FIG. 1. FIG. 3 shows only one side of the carrier 2, having four separate lenses 4, one for each light source 3, that are fitted close to the cover member 5. It is possible that there is provided light sources 3 only on one side of the carrier 2. The cover member 5 may then be appropriately shaped to suit the arrangement. For example the cover member 5 may only be provided with lenses 4 on the side that contains any light sources 3. It is possible that a flat lamp 1 according to the invention comprises light sources 3 on any or both sides of the carrier 2, as well as anywhere on the carrier 2. For instance, if it is required with a more directed light in one direction, a flat lamp may be adapted to spread light from one side of the carrier 2. Also, direction of light may be altered by having different lenses 4. A symmetrically cut lens 4 may spread light virtually uniformly around the light source 3, while a non-symmetrically cut lens 4 may direct the light in a specific required direction. It is also a possibility that several light sources 3 share the lens 4. For example, a larger lens may be arranged to cover more than one light source 4. In the case of only having light sources 3 provided on a front side of the carrier 2, a back side of the carrier 2 may assist to transfer heat from the light sources 3, allowing the heat to transfer through the carrier 2 to a thermally conductive layer on the back side.

Figure 4:
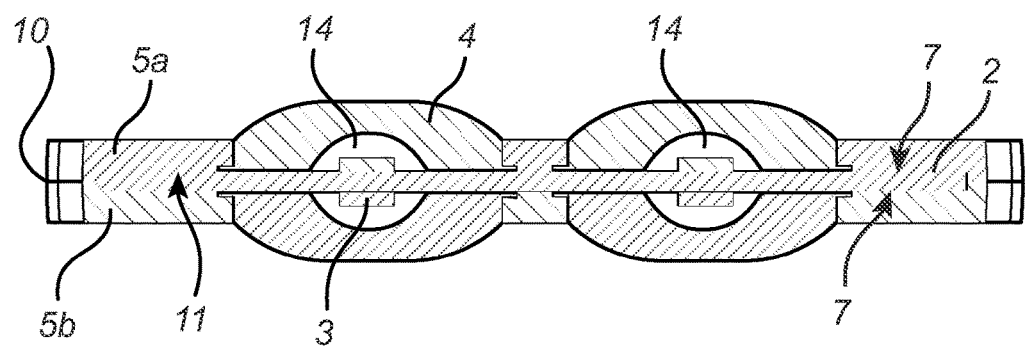
FIG. 4 is a cross-sectional view across the lens of the lighting device of FIG. 3.

FIG. 4 depicts a cross sectional view of a flat lamp 1, taken along a line perpendicularly to the longitudinal axis A1, across the lenses 4 in FIG. 3. The cover member 5a, 5b is arranged closely to the carrier 2, so as to allow thermal contact, for the heat arising from each light source 3 to be transferred via the cover member to the ambient. The lens 4 in FIG. 4 is separate from the cover member, being arranged to be tightly held by the cover member against the carrier 2. The lens 4 in FIG. 4 has a flat surface arranged against the carrier 2 and a domed concave shape arranged above the light source 3. Externally, the lens 4 has a convex shape in order to spread the light evenly to its surroundings. The lens 4 has an inner cavity 14 adjacent the light source 3. The cut of the inner cavity 14 and the external surface of the lens 4 may differ in order to produce a required luminous intensity distribution to its surroundings or, whenever appropriate, add a more focused light in a certain direction.

Figure 5:
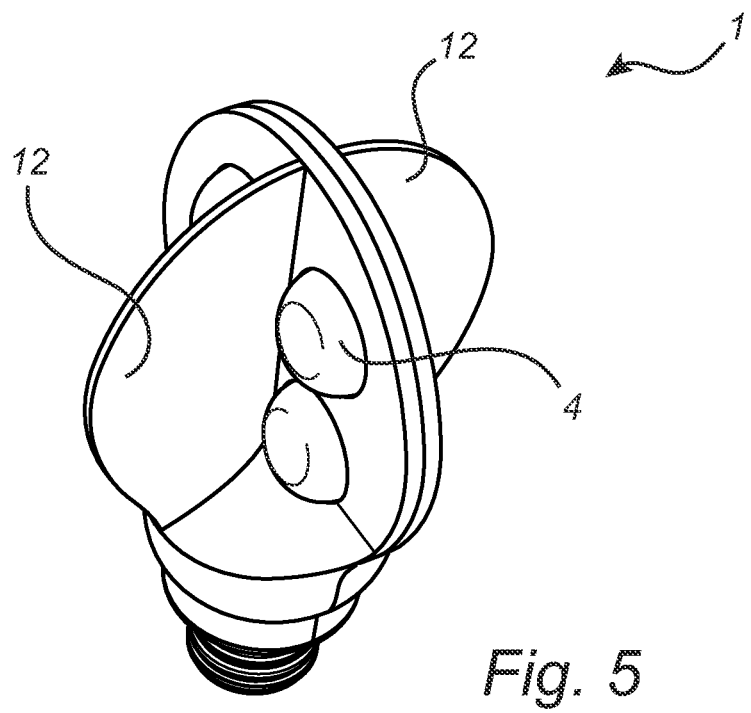
FIG. 5 is a perspective view of a lighting device according to an embodiment of the invention comprising ribs.
Figure 6:
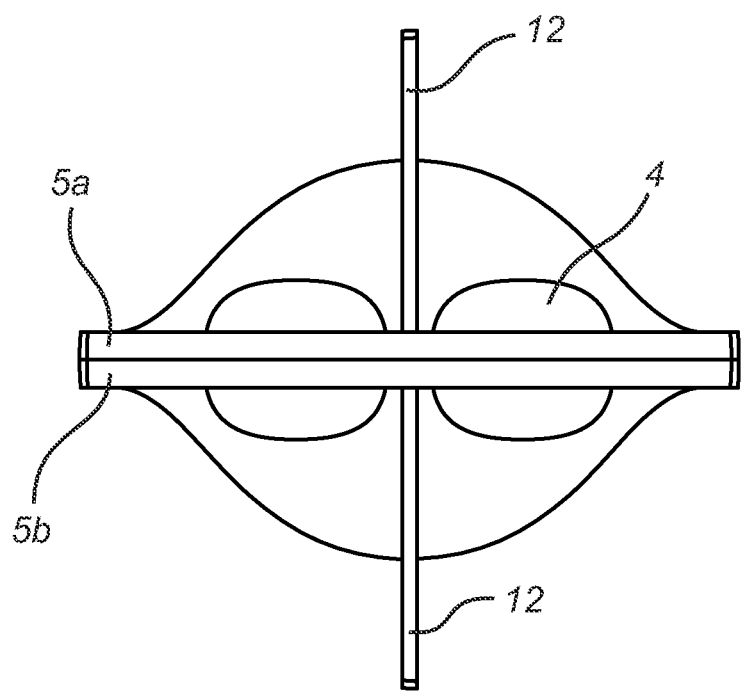
FIG. 6 is a top view of the lighting device of FIG. 5.

The flat lamp 1 according to the invention, the cover member 5 may be provided with a second section 12 which is arranged with an angle with respect to the first section. FIGS. 5 and 6, show a type of flat lamp 1 with a second section 12 of the cover member 5, in the shape of wings arranged perpendicular to the carrier 2. The second section 12 is preferably made from a thermally conductive material, possibly the same material as the cover member or such as a thermally enhanced plastic to improve thermal performance. The second section 12 may be arranged to improve design, strength, thermal and/or optical properties. For instance, the second section 12 may be reflective or refractive for better luminous intensity distribution. The second section 12 may be shaped and arranged anywhere suitable. For instance, the second section 12 may be shaped as ribs, fins or pins, arranged to improve thermal and/or optical performance. The wings, ribs, fins or pins forming the second section 12 can be placed at any angle relative to the cover members 5a, 5b. It is also possible to provide a number of light sources 3 on the second section 12, as shown on the crossed lamp 30 in FIGS. 7 and 8, e.g. for higher lumen packages. The cover member may further be provided with openings to improve the thermal and optical properties of the arrangement.

Figure 7:
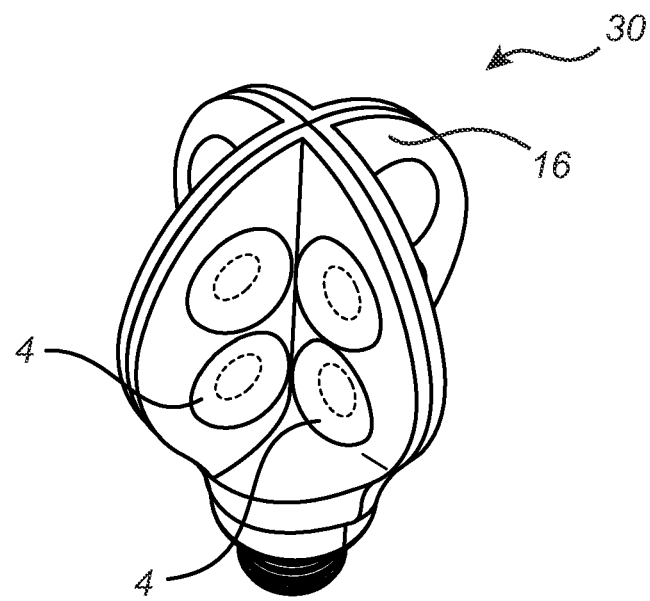
FIG. 7 is a perspective view of a lighting device according to an embodiment of the invention comprising orthogonally arranged carriers.
Figure 8:
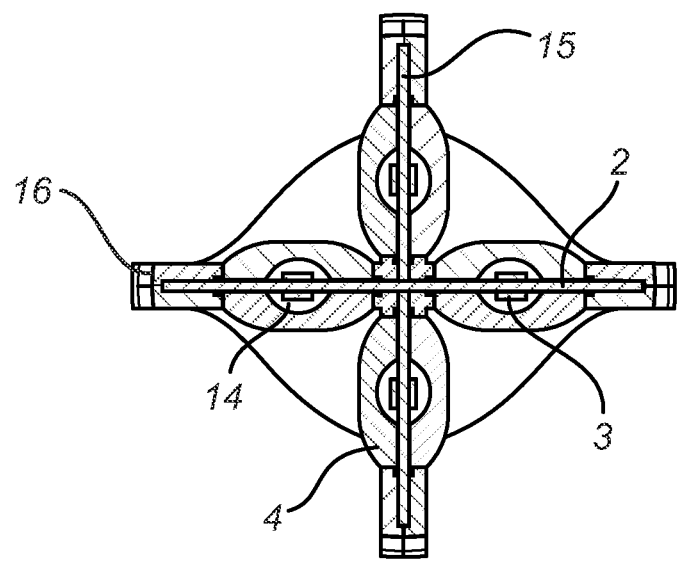
FIG. 8 is a cross sectional view, seen in the direction of the longitudinal axis across the lenses of the lighting device of FIG. 7.

In FIGS. 7 and 8 a crossed lamp 30 is shown comprising multiple carriers 2, 15. On the carriers 2, 15 light sources and electrical connections for powering the light sources are arranged. The carriers 2, 15 are covered by a cover member 16, adapted to suit the crossed design. The light sources 3 may be placed anywhere appropriate as required. The lenses 4 are adapted accordingly regarding shape, size and cut, in order to provide the required luminous intensity distribution. Possibly, the lenses 4 are cut in a non-symmetrical way to reflect the light away from the centre of the crossed lamp 30. It is possible that the second carrier 15 is angled differently relative to the first carrier 2. For instance, the angle between the first carrier 2 and the second carrier 15 may be larger or smaller than the shown 90 degrees. Further, it is possible that the two carriers 2, 15 do not cross each other, but are arranged in contact with each other under an angle.

Figure 9:
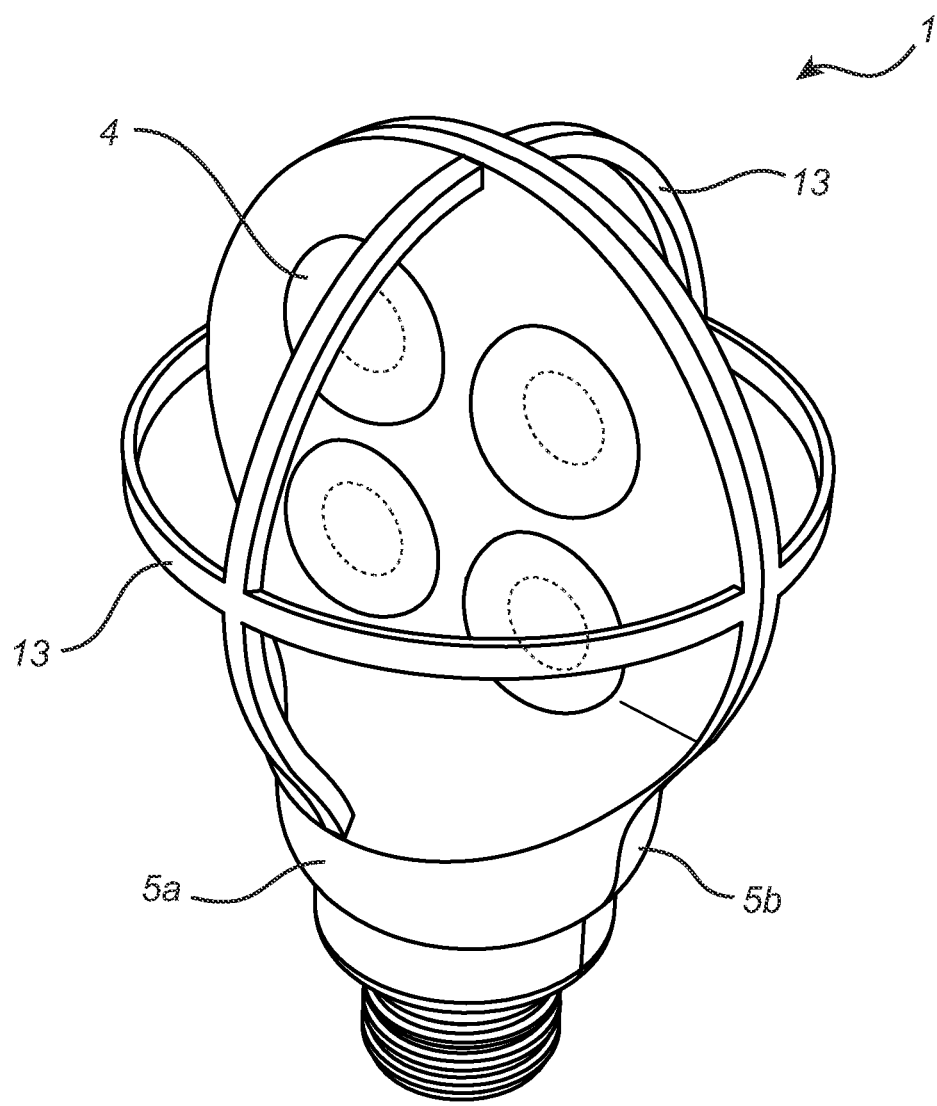
FIG. 9 is a perspective view of a lighting device according to an embodiment of the invention, comprising additional longitudinal and transverse rings.

FIG. 9 shows a lamp as described according to FIG. 1 to which a ring 13 has been added for extra support longitudinally and transversally relative to the longitudinal axis A1, around the flat lamp 1. The ring 13 may provide support to a luminaire. The ring 13 may also be of a thermally conductive material, such as aluminum or the like, or of the same material as the cover members 5a, 5b, to provide improved thermal performance. The ring 13 can be located anywhere around the flat lamp 1.

Figure 10:
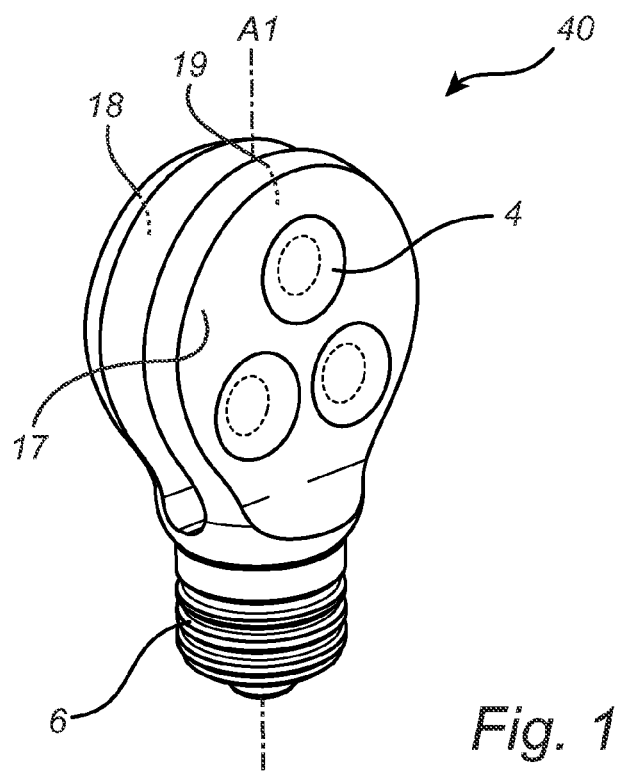
FIG. 10 is a perspective view of a lighting device according to an embodiment of the invention comprising multiple parallel-arranged carriers.

In FIG. 10, there is shown an embodiment of a lamp having a double walled arrangement 40. This arrangement is designed having two carriers 18, 19 arranged in parallel relative to each other. The carriers 18, 19 are provided with a plurality of light sources 3 and lenses. The carriers 18, 19 are covered with a cover member 17, covering each of the carriers 18, 19. The parallel design may be required for instance if additional cooling of the carrier is required, and hence allowing the additional surface area of cover member 17 to transfer the additional heat arising from the light sources 3. The cover member 17 is, due to its complex design, arranged to be suitably assembled. For instance, the cover member 17 may be designed in a plurality of parts to be joined.

Figure 11:
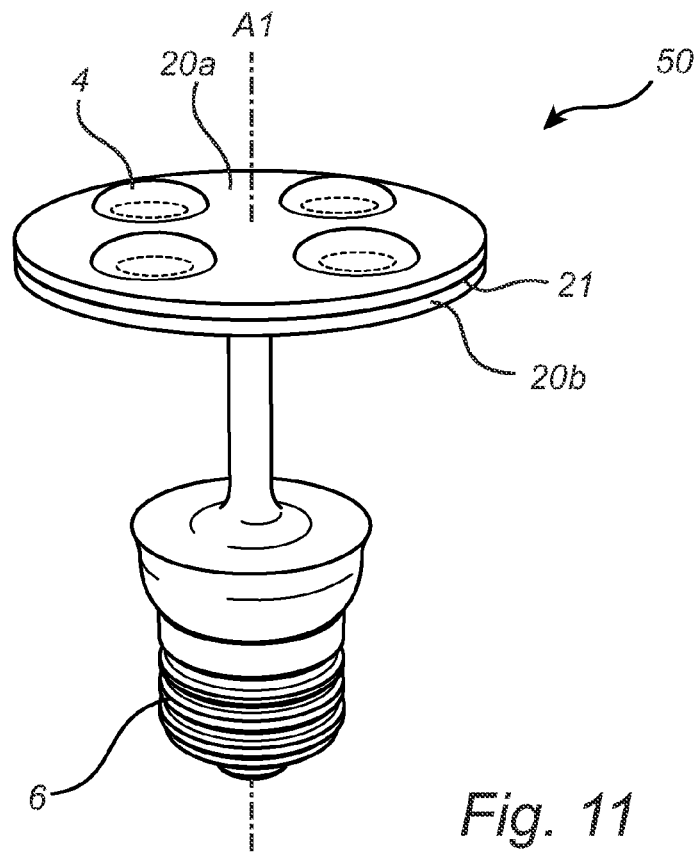
FIG. 11 is a perspective view of a lighting device according to an embodiment of the invention in the arrangement of a flat spot type of lamp.

FIG. 11 shows a flat lamp in the arrangement as a flat spot light 50. The flat spot light 50 comprises a carrier 21 arranged transversally relative to the longitudinal axis A1. The flat spot light 50 comprises a connection between the cap 6 and the carrier 21. This connection may be by an additional carrier arranged from the cap to the carrier 21, or alternatively another type of connection such as wire. The carrier 21 is provided with a plurality of light sources 3 and a cover member 20a, 20b. The first cover member 20a in FIG. 11 comprises a plurality of lenses 4, integrated in the cover member 20a. The cover members 20a, 20b may be made from the same type of material. Alternatively, the cover members 20a, 20b are made of different material, including the part of the second cover member 20b extending to the cap 6. It is also possible that the lenses 4 are separate from the first cover member 20a. Light sources and related optical structures may be arranged on one side or on both sides of the carrier 21. The carrier 21 may also be oriented differently relative to the longitudinal axis A1.

Figure 12:
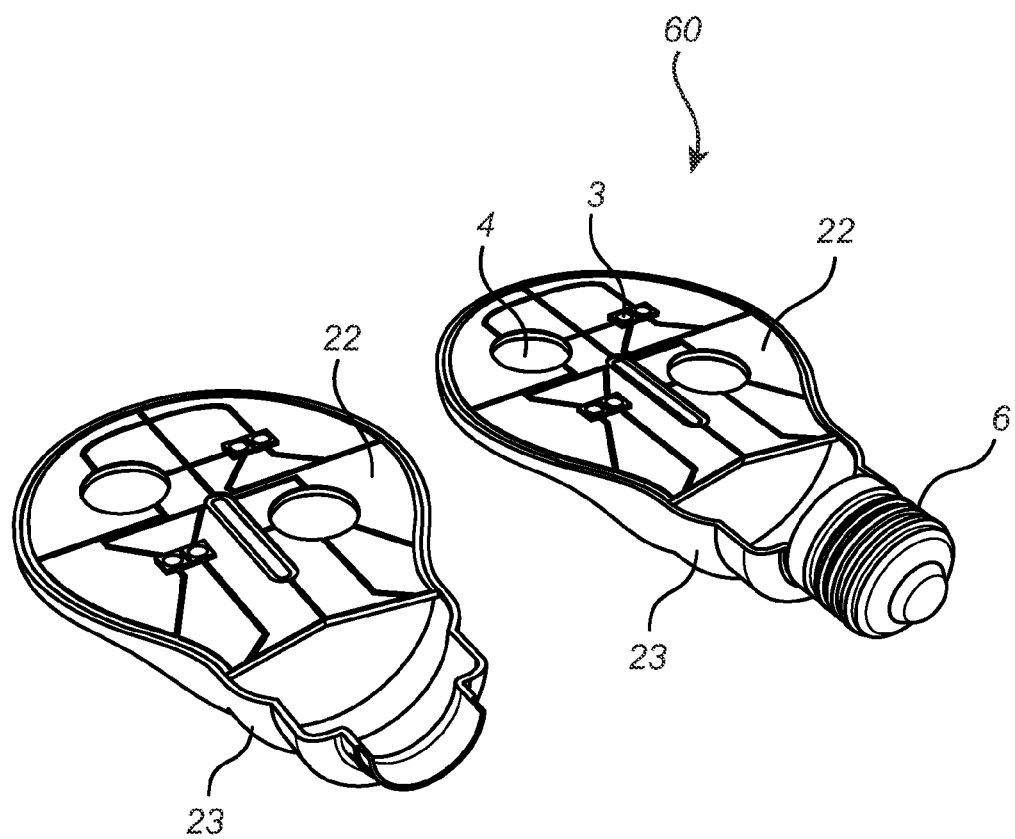
FIG. 12 is a perspective view of a lighting device according to an embodiment of the invention, with the carrier formed as an integrated part with the cover member.

FIG. 12 shows a flat lamp 60 comprising a first cover member 23 with lenses 4, and wherein the carrier is formed as an integrated part of an inner surface 22 of the first cover member 23. The electrical connections are printed on the inner surface 22 of the first cover member 23. Light sources 3 are arranged on the inner surfaces 22 of both parts of the first cover member 23. The second cover member is substantially identical to the first cover member 23. A lens 4 is arranged on one of the cover members with a corresponding light source 3 on the other cover member. The lenses 4 and light sources 3 are arranged in an alternated manner. A heat spreading layer may be arranged on the inner surface 22 to spread the heat generated by the light sources 3 over the inner surface 22.

In the lighting devices described in connection with FIGS. 5-12 the optical structure for outcoupling the light from the lighting device comprises one or more lenses 4. Alternatively, lightguides or scattering optics can be used as optical structure.

Figure 13:
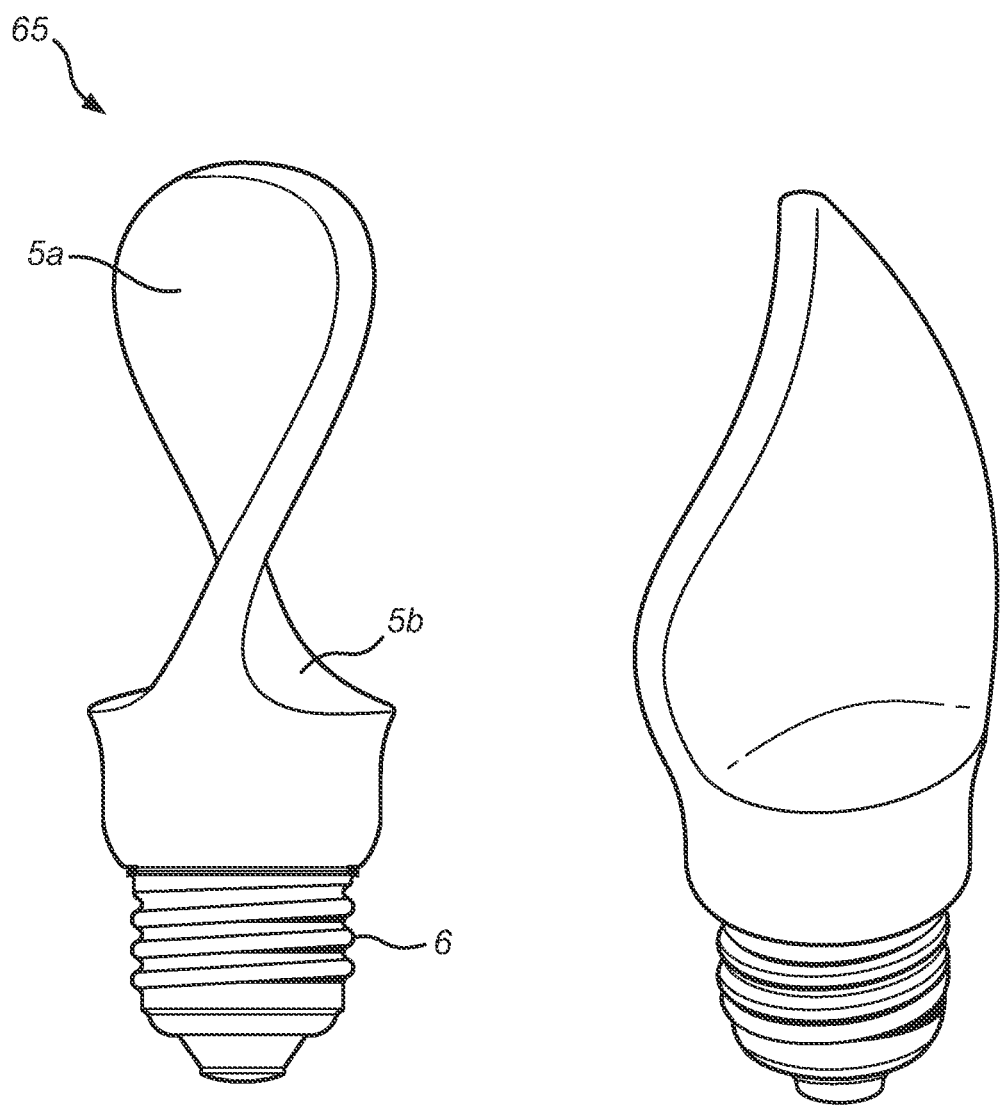
FIG. 13 is a side view of a lighting device according to an embodiment of the invention, comprising a cover member with a double-helical surface.

FIG. 13 shows a flat lamp 65 in which the carrier (not shown) is shaped as a double-helical surface. This surface extends in the direction of the longitudinal axis A1. This carrier can be sandwiched in between the two cover members 5a, 5b. This embodiment is further similar to the construction of the embodiment as shown in e.g. FIG. 1. It may comprise one or more light sources, such as LEDs, mounted on the carrier and a light-transmitting part of the cover members to enable light exiting from the light sources 3.

The double-helical or twisted embodiment has the advantage that the desired luminous intensity distribution will at least partly be determined by the amount of twist between the lower side, near the connection member, and the upper side of the carrier. The effect of the improved luminous intensity distribution is caused by the fact that in a double-helical structure the orientation of the normal of the double-helical surface relative to the longitudinal axis A1 of the lighting device is not constant. The normal of a first portion of the surface is different from the normal of a second portion. Typically, a solid state light source mounted on a carrier, emits light with the central axis of its emission profile pointing in the direction of the normal of the surface at the position the solid state light is mounted. The twisted or curved shaped of the carrier enables an improved light distribution around the lighting device.

The effect of the double-helical shaped surface on the luminous intensity distribution is evidently dependent on the amount of twist between the upper side and the lower side of the carrier.

In order to contribute an effective amount to the luminous intensity distribution the twist angle between a first end of the double-helical surface pointing in the direction of the connection member, and a second end pointing away from said connection member, should differ by an angle that is in the range between 15° and 360°. If so desired, the amount of twist may also be larger than 360°.

Good results are obtained when this twist angle is chosen between 60° and 180°, better results with a twist angle of about 90°. Preferably the twist angle is about 120°. Such a design enables it to obtain a uniform luminous intensity distribution without applying any optical structures in front of the LEDs, by redirecting the light emitted by the light sources arranged on the carrier. It is evident that a combination of a twisted carrier with optical structures like lenses, light guides or scattering optics is possible as well.

Figure 14:
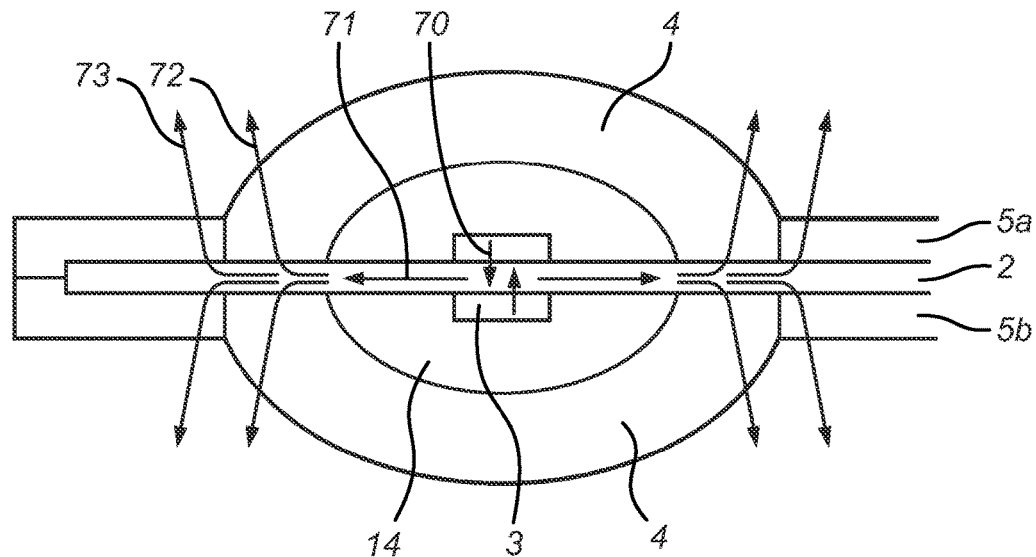
FIG. 14 is a portion of the lighting device according to the present invention, indicating the heat flow through the device.

The thermal properties of a lighting device according to the present invention are determined by a short thermal path between the solid state light source 3 and the outside of the cover members 5a, 5b, where the heat is dissipated to the ambient. This is realized, as illustrated in FIG. 14, by a solid state light source 3 disposed on a carrier 2 to which the heat generated by the solid state light 3 source is transferred, indicated by arrows 70. The thermal interface from the carrier 2 to the cover members 5a, 5b and the optical structure 4 ensures a short thermal path to the outside of the lighting device 1.

The best way to realize this improved thermal performance is when the carrier 2 comprises a thermally conductive material which has a first coefficient of thermal conductivity and the cover members 5a, 5b have a second coefficient of thermal conductivity, the first coefficient of thermal conductivity being larger than the second coefficient of thermal conductivity.

The first coefficient of thermal conductivity should be sufficiently large to spread the heat from the solid state light source over the full carrier 2 with a small temperature drop (arrow 71), the second coefficient of thermal conductivity being sufficient to get a small temperature drop over the thickness of the cover (arrows 72,73). The required first coefficient of thermal conductivity is connected to the thickness of the thermally conductive material on the carrier 2 and the effective heat transfer coefficient from the cover members 5a, 5b to the ambient.

More precisely, while heat conduction is determined by the product of the coefficient of thermal conductivity and the thickness of thermally conductive material, and while heat transfer to the ambient is determined by the effective heat transfer coefficient of convection and radiation combined, the ratio of heat conduction over heat transfer to ambient should be sufficient, as is explained by the fin efficiency theory. The second coefficient of thermal conductivity should have a minimum value to keep the temperature drop over the cover thickness limited, e.g. 0.2 W/mK which is typical for standard engineering plastics.

Good results are obtained when the first coefficient of thermal conductivity is in the range from 100-300 W/mK, preferably between 160 and 240 W/mK, and the second coefficient of thermal conductivity is in the range from 0.2-10 W/mK, preferably between 0.5 and 5 W/mK.

The thermal behavior of the lighting device is determined by a number of parameters in the design of the lighting device.

When designing lighting devices with LEDs meant for replacing the well-known incandescent lamps, also referred to as retrofit lamps, it is required to have a design in which the thermal conductivities in combination with the surface that radiates the heat to the ambient ensures a maximum temperature of the lighting device in order to safeguard its life time performance. The design considerations are given for retrofit lamps with different light output levels.

TABLE 1

| flux lm | system efficacy lm/W | electrical input power W | lumen equivalent lm/W | light power W | heat load W | max temp C | ambient C | dT max K | Rth required K/W |
|---|---|---|---|---|---|---|---|---|---|
| 1600 | 80 | 20 | 300 | 5.3 | 14.7 | 100 | 25 | 75 | 5.1 |
| 1100 | 80 | 13.8 | 300 | 3.7 | 10.1 | 100 | 25 | 75 | 7.4 |
| 800 | 80 | 10 | 300 | 2.7 | 7.3 | 100 | 25 | 75 | 10.2 |
| 600 | 80 | 7.5 | 300 | 2.0 | 5.5 | 100 | 25 | 75 | 13.6 |
| 450 | 80 | 5.6 | 300 | 1.5 | 4.1 | 100 | 25 | 75 | 18.2 |

In Table 1, the required thermal resistance $R_{th}$ is calculated for retrofit lamps with different light output. The range from 450-1600 lumen roughly coincides with incandescent bulb with a power consumption between 40 and 100 W. For present day LED systems the system efficacy (that is the amount of light generated per watt power used by the LED system) is about 80 lm/W at a lumen equivalent of 300 lm/W (that is the amount of light per watt light power). From these figures the heat load is calculated; this heat load is the amount of heat that is generated but that is not transferred to light. So, this is the amount of heat that should be radiated from the lighting device, for instance by cooling.

Normal design conditions for lighting devices assume a maximum allowable temperature in the system of 100° C. and an ambient temperature of 25° C. This implies that the lighting device should be designed to have a cooling capacity of at least 75° C. Therefore, the thermal resistance $R_{th}$ of the lighting device can be calculated to be the quotient of heat load and the temperature difference of 75° C. In a design the values of the thermal resistance as given in the last column of Table 1 should be adhered to.

With these required maximum thermal resistances the minimum required area of the outer cover of the lighting device can be calculated. These quantities are related by the well-known formula:

$$R_{th} = \frac{1}{h.A} + R_{th,cover} + R_{th,air\ gap}$$

In this formula:
$R_{th}$ is the total thermal resistance, as given in Table 1.
$R_{th,cover}$ is the thermal resistance of the cover material. This is dependent on the choice of the material. For commonly used normal plastic (NP) the thermal resistance through the cover is about 2 K/W; for thermal plastic (TP) it is 0.5 K/W;
$R_{th,air\ gap}$ is the thermal resistance between the carrier and the cover. It is known that for an air gap of 0.15 mm this resistance is about 1 K/W and for no air gap it is 0 K/W. For these model calculations it is fixed as 0.5 K/W.
h is the average heat transfer coefficient which typically for convection and radiation 12 W/m²/K
A is the outer area required for fulfilling the thermal demands of a design. This is the area the retrofit lamps should at least have in order to operate savely with respect to thermal performance.

TABLE 2

| flux lm | Rth required K/W | cover material | est. Rth through cover K/W | est. Rth through air gap | avg heat transfer coeff W/m²K | fin efficiency | outer area required cm² |
|---|---|---|---|---|---|---|---|
| 1600 | 5.1 | NP | 2 | 0.5 | 12 | 0.9 | 354 |
| 1600 | 5.1 | TP | 0.5 | 0.5 | 12 | 0.9 | 225 |
| 1600 | 5.1 | NP | 2 | 0.5 | 12 | 0.8 | 399 |
| 1600 | 5.1 | TP | 0.5 | 0.5 | 12 | 0.8 | 253 |
| 1100 | 7.4 | NP | 2 | 0.5 | 12 | 0.9 | 188 |
| 1100 | 7.4 | TP | 0.5 | 0.5 | 12 | 0.9 | 144 |
| 1100 | 7.4 | NP | 2 | 0.5 | 12 | 0.8 | 211 |
| 1100 | 7.4 | TP | 0.5 | 0.5 | 12 | 0.8 | 162 |
| 800 | 10.2 | NP | 2 | 0.5 | 12 | 0.9 | 120 |
| 800 | 10.2 | TP | 0.5 | 0.5 | 12 | 0.9 | 100 |
| 800 | 10.2 | NP | 2 | 0.5 | 12 | 0.8 | 135 |
| 800 | 10.2 | TP | 0.5 | 0.5 | 12 | 0.8 | 113 |
| 600 | 13.6 | NP | 2 | 0.5 | 12 | 0.9 | 83 |
| 600 | 13.6 | TP | 0.5 | 0.5 | 12 | 0.9 | 73 |
| 600 | 13.6 | NP | 2 | 0.5 | 12 | 0.8 | 94 |
| 600 | 13.6 | TP | 0.5 | 0.5 | 12 | 0.8 | 82 |
| 450 | 18.2 | NP | 2 | 0.5 | 12 | 0.9 | 59 |
| 450 | 18.2 | TP | 0.5 | 0.5 | 12 | 0.9 | 54 |
| 450 | 18.2 | NP | 2 | 0.5 | 12 | 0.8 | 66 |
| 450 | 18.2 | TP | 0.5 | 0.5 | 12 | 0.8 | 61 |

In Table 2 the results of the calculations of the required minimum area of the retrofit flat lamp designs are given. This is done for two different efficiencies of the fin area, that is the area of the cover that acts as a cooling area. This efficiency is determined by the ability of the carrier 2 to spread the heat. For a carrier made out of aluminium the efficiency is 0.9, while for a normal PCB it is 0.8. So, the required area for having a good thermal design is the area calculated by the above formula, divided by the area efficiency.

The calculations are done for cover material made from normal plastics (NP) and from thermal plastics (TP). It is evident that the performance of thermal plastics is better, leading to a smaller required outer area for reaching the same thermal performance of the lamp The last column shows that these required surfaces can be realized in a retrofit design for the desired lumen values in terms of the sizes used for the well-known incandescent bulbs. For the lumen values up to 800 lumen an equivalent of an A19 type lamp can be used. This is comparable to a standard 60 mm incandescent bulb. For the 1100 lumen design an equivalent of an A21 type of lamp can be used, comparable to the 67 mm incandescent bulb. All the designs can be made with a light source with one fin, that is with a single carrier as for instance given in FIG. 1. The 1600 lumen design can also be made with an A21 type lamp, but in this case a two-fin construction, as for instance given in FIG. 10 is required in order to have sufficient area for cooling.

The fin efficiency as given in Table 2 is determined by the spreading of the heat over the carrier 2. The effective distance of spreading of the heat in the carrier is governed by the formulae:

$$L_{char} = \sqrt{\frac{k.t}{n.h}}$$

$$L_{eff} = L_{char} \cdot \tanh\left(\frac{L_{app}}{L_{char}}\right)$$

$$\text{Efficiency} = \frac{L_{eff}}{L_{app}}$$

Figure 15:
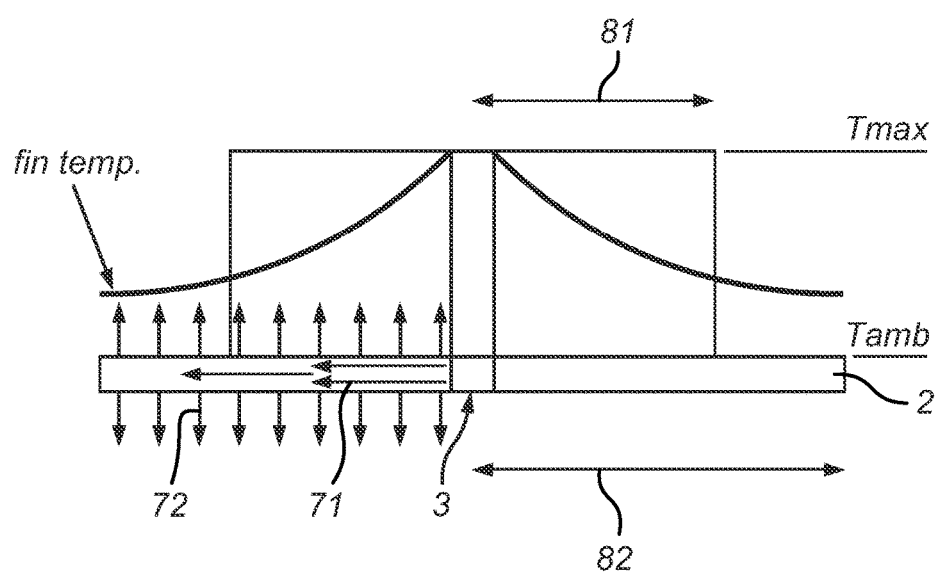
FIG. 15 is an explanatory figure for the thermal model of the lighting device.
Figure 16A:
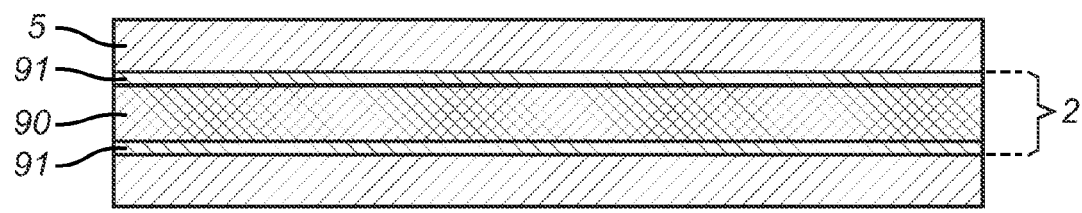
FIGS. 16A and 16B give two different examples of a carrier for use in the lighting device.
Figure 16B:
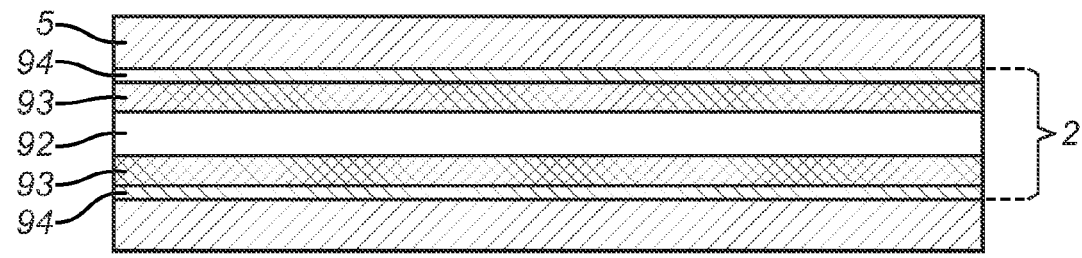

This is illustrated in FIG. 15, which model schematically shows a solid state light source 3 in a carrier 2 and the thermal behavior of this light source. When in operation, the light source heats up to $T_{max}$ at an ambient temperature $T_{amb}$. Then the temperature in the fin (that is understood to be the overall environment of the light source) declines when the distance to the light source increases. The effective size $L_{eff}$ 81 of the fin is determined by the demand that the area defined by $L_{eff}$ and a constant temperature $T_{max}$ is equal to the area under the curve of the fin temperature until the apparent size $L_{app}$ 82 of the fin. $L_{app}$ is determined by the geometrical design of the lighting device 1. In this example an $L_{app}$ of 2 cm has been chosen, meaning that it is assumed that the heat dissipated in a light source is distributed through the carrier over a distance of 2 cm.
Further, in this formulae:
K is the first coefficient of thermal conductivity (W/mK),
t is the thickness of the carrier
n is the number of sides exposed, in this case 2.
h is the average heat transfer coefficient which typically for convection and radiation 12 $W/m^2/K$ The fin efficiency was determined for two different types of carrier, which are shown in FIGS. 16A and B. The first type—FIG. 16A—is a standard PCB design of a carrier 2 with a PCB core 90 covered on both sides with a copper layer 91 of thickness of 35 μm and of 70 μm, with a first coefficient of thermal conductivity of 400 W/mK. The second type—FIG. 16B—is a carrier 2 with an aluminium spreader 92 with thickness of 0.2 mm and 0.5 mm provided with a PCB core 93 and thin copper layer 94 (FR4 type) on both sides of the aluminium, and a first coefficient of thermal conductivity of 200 W/mK The results are given in Table 3, which shows that a fin efficiency is at least 90%.

TABLE 3

| k W/mK | type | t mm | n | h W/m²K | $L_{char}$ m | $L_{app}$ m | $L_{eff}$ m | fin efficiency |
|---|---|---|---|---|---|---|---|---|
| 400 | copper 2x35 mu | 0.070 | 2 | 12 | 0.034 | 0.020 | 0.0180 | 0.90 |
| 400 | copper 2x70 mu | 0.140 | 2 | 12 | 0.048 | 0.020 | 0.0189 | 0.95 |
| 200 | alu carrier | 0.2 | 2 | 12 | 0.041 | 0.020 | 0.0185 | 0.93 |
| 200 | alu carrier | 0.5 | 2 | 12 | 0.065 | 0.020 | 0.0194 | 0.97 |

By way of example a simulation was done for a lighting device with a light output of 800 lumen. From Table 1 it follows that the thermal resistance must be below 10.2 K/W. For a flat lighting device for retrofitting an incandescent lamp of the A19 type, this thermal resistance $R_{th}$ was calculated for different types of carriers and cover plastics. The simulation shows that at least a carrier with an aluminium core and a thermal plastic as cover material fulfills all the demands regarding the required thermal performance.

The lighting device 1 may comprise a controller adapted to control each of the at least one solid state light sources individually. The controller may be integrated in the printed circuit board for the at least one solid state light source and may further contribute to the compact lighting device with few parts. The controller may further be adapted to control the light sources separately. Thereby, when the arrangement comprises a plurality of light sources, the controller may control the light sources to different color, different luminous intensity distribution etc. The different luminous intensity distribution may comprise different beam shapes of the light output from the light sources. The person skilled in the art realizes that the present invention by no means is limited to the preferred embodiments described above. On the contrary, many modifications and variations are possible within the scope of the appended claims. For example, the shape of the carrier and cover member may be different, and the locations of the light sources may be optional. For instance, not only flat bulb shapes are possible, but any shapes desired such as square shapes, angled shapes or heart shapes.

Additionally, variations to the disclosed embodiments can be understood and effected by the skilled person in practicing the claimed invention, from a study of the drawings, the disclosure, and the appended claims. In the claims, the word "comprising" does not exclude other elements or steps, and the indefinite article "a" or "an" does not exclude a plurality. A single processor or other unit may fulfill the functions of several items recited in the claims. The mere fact that certain measures are recited in mutually different dependent claims does not indicate that a combination of these measured cannot be used to advantage.

The invention claimed is:

1. A lighting device comprising:
a solid state light source;
a carrier on which said solid state light source is arranged, the carrier having a front side larger than an edge side, such that an amount of heat generated by the light source is transmitted into the carrier;
a cover member disposed on the carrier, whereby the light source is arranged between the carrier and a light-transmitting part of the cover member, such that a thermal interface exists between the carrier and the cover member, the cover member having an outer surface being a portion of the outside of the lighting device and having an inner surface being opposite to the outer surface and being in thermal contact with the front side of the carrier, such that the thermal interface is formed,
a connection member having a fixed position relative to the carrier for mechanically and electrically connecting the lighting device to a socket, wherein,
the thermal interface is arranged to transmit there through a majority of the heat transmitted into the carrier from the light source;
wherein the carrier comprises a thermally conductive material having a first coefficient of thermal conductivity and the cover member having a second coefficient of thermal conductivity, the first coefficient of thermal conductivity being larger than the second coefficient of thermal conductivity.

2. The lighting device according to claim 1, wherein the first coefficient of thermal conductivity is in the range from 100-300 W/mK and the second coefficient of thermal conductivity is in the range from 0.2-10 W/mK.

3. The lighting device according to claim 1, wherein the thermally conductive material is disposed as thermally conductive layer on the carrier.

4. The lighting device according to claim 3, wherein the thermally conductive layer is electrically connected to the solid state light source.

5. The lighting device according to claim 1, wherein a thermal interface material, TIM, is arranged to fill a space between the cover member and the carrier.

6. The lighting device according to claim 1, further comprising: a second solid state light source arranged on a back side of the carrier being opposite to the front side, a second cover member disposed on the carrier, whereby the second light source is arranged between the carrier and a light-transmitting part of the second cover member, such that a thermal interface exists between the carrier and the second cover member, the second cover member having a second outer surface being a second portion of the outside of the lighting device and having a second inner surface being opposite to the second outer surface and being in thermal contact with the back side of the carrier, such that the second thermal interface is formed.

7. The lighting device according to claim 6, wherein the cover member and the second cover member are adapted to be attached to each other and to enclose the carrier.

8. The lighting device according to claim 7, wherein at least 50%, preferably 90% of the front side of the carrier is in thermal contact with the inner surface of the cover member.

9. The lighting device according to claim 1, wherein the carrier is one of a substrate, a board, printed circuit board, or an aluminum spreader provided with a PCB core and a copper layer.

10. The lighting device according to claim 1, wherein the cover member comprises a protrusion adapted to extend through an opening in the carrier to align the carrier relative to the cover member.

11. The lighting device according to claim 10, wherein the carrier is positioned transversally relative to the longitudinal axis.

12. The lighting device according to claim 10, wherein the carrier is a cylinder having an axis coinciding with the longitudinal axis.

13. The lighting device according to claim 10, wherein the carrier is a double-helical shaped surface positioned in parallel to the longitudinal axis.

14. The lighting device according to claim 13, wherein the double-helical surface has a first end pointing in the direction of the connection member, and a second end pointing away from said connection member, wherein the respective orientations of double-helical surface perpendicular to the longitudinal axis at the first end and at the second end differ by an angle that is in the range between 15° and 360°.

15. The lighting device according to claim 14, wherein the respective orientations differ by an angle that is in the range between 60° and 180°.

16. The lighting device according to claim 1, further comprising a second carrier with a second front and back side positioned in parallel with the longitudinal axis and having at least one additional solid state light source arranged on the second front side.

17. The lighting device according to claim 16, wherein the second carrier is arranged in parallel with the carrier.

18. The lighting device according to claim 16, wherein the second carrier is arranged orthogonal relative to the carrier.

19. The lighting device according to claim 1 comprising a second solid state light source, wherein the lighting device comprises electrical connections for independently powering the solid state light source and the second solid state light source.

20. The lighting device according to claim 1 comprising a second solid state light source, wherein the lighting device comprises a controller for individually controlling the solid state light source and the second solid state light source.

21. The lighting device according to claim 1, wherein the lighting device has a longitudinal axis passing through the connection member and the carrier is positioned in parallel with the longitudinal axis.

* * * * *